United States Patent
Zhang

(10) Patent No.: US 12,426,488 B2
(45) Date of Patent: Sep. 23, 2025

(54) METHOD FOR MANUFACTURING ARRAY SUBSTRATE, ARRAY SUBSTRATE, DISPLAY PANEL, AND DISPLAY DEVICE

(71) Applicants: Beijing BOE Technology Development Co., Ltd., Beijing (CN); BOE Technology Group Co., Ltd., Beijing (CN)

(72) Inventor: Aidi Zhang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 560 days.

(21) Appl. No.: 17/775,735

(22) PCT Filed: May 7, 2021

(86) PCT No.: PCT/CN2021/092110
§ 371 (c)(1),
(2) Date: May 10, 2022

(87) PCT Pub. No.: WO2021/227949
PCT Pub. Date: Nov. 18, 2021

(65) Prior Publication Data
US 2022/0392929 A1    Dec. 8, 2022

(30) Foreign Application Priority Data
May 13, 2020    (CN) .......................... 202010402253.7

(51) Int. Cl.
*H01L 27/12* (2006.01)
*H10D 86/01* (2025.01)
(Continued)

(52) U.S. Cl.
CPC ......... *H10K 71/20* (2023.02); *H10D 86/0212* (2025.01); *H10K 59/131* (2023.02);
(Continued)

(58) Field of Classification Search
None
See application file for complete search history.

(56) References Cited

U.S. PATENT DOCUMENTS

2016/0035917 A1*  2/2016  Gershon ............... H10K 71/70
                                                              438/93
2022/0392929 A1* 12/2022  Zhang .................. H10K 71/20

FOREIGN PATENT DOCUMENTS

CN    108873481 A    11/2018
CN    108987613 A    12/2018
(Continued)

OTHER PUBLICATIONS

Wang, Gongming, et al. "Wafer-scale growth of large arrays of perovskite microplate crystals for functional electronics and optoelectronics." Science advances 1.9 (2015): e1500613.
(Continued)

*Primary Examiner* — Long Pham
(74) *Attorney, Agent, or Firm* — IPro, PLLC

(57) ABSTRACT

A method for manufacturing an array substrate includes: forming a patterned film layer on a side of a substrate, wherein the patterned film layer is provided with a plurality of grooves; forming a first precursor structure in the groove, wherein a material of the first precursor structure includes a first precursor; and disposing, in an environment of a gaseous second precursor, the substrate on which the first precursor structure is formed, such that the gaseous second precursor is reacted with the first precursor structure to form a perovskite crystal structure; wherein one of the first precursor and the gaseous second precursor includes a metal
(Continued)

halide, and the other of the first precursor and the gaseous second precursor includes one of a formamidine halide, a methyl-amine halide, a cesium halide, and a hydrogen sulfide.

13 Claims, 7 Drawing Sheets

(51) Int. Cl.
*H10K 59/131* (2023.01)
*H10K 71/00* (2023.01)
*H10K 71/20* (2023.01)
*H10K 71/40* (2023.01)
*H10K 85/50* (2023.01)
*H10K 59/12* (2023.01)

(52) U.S. Cl.
CPC ............. *H10K 71/00* (2023.02); *H10K 71/40* (2023.02); *H10K 85/50* (2023.02); *H10K 59/1201* (2023.02)

(56) References Cited

FOREIGN PATENT DOCUMENTS

| | | |
|---|---|---|
| CN | 110676381 A | 1/2020 |
| CN | 110808316 A | 2/2020 |
| CN | 111416066 A | 7/2020 |
| CN | 112599691 A | 4/2021 |

OTHER PUBLICATIONS

CN202010402253.7 first office action.

* cited by examiner

METHOD FOR MANUFACTURING ARRAY SUBSTRATE, ARRAY SUBSTRATE, DISPLAY PANEL, AND DISPLAY DEVICE

CROSS-REFERENCE TO RELATED APPLICATION

This application is a US national phase application based on PCT/CN2021/092110, filed on May 7, 2021, which claims priority to Chinese Patent Application No. 202010402253.7, filed on May 13, 2020 and entitled "ARRAY SUBSTRATE, METHOD FOR MANUFACTURING SAME, DISPLAY PANEL, AND DISPLAY APPARATUS", the entire contents of which are incorporated herein by reference in their entireties.

TECHNICAL FIELD

The present disclosure relates to the field of display technologies, and in particular, relates to an array substrate, a method for manufacturing the same, a display panel, and a display apparatus.

BACKGROUND

Perovskite is an important photoelectric material. Perovskite has advantages of high fluorescence quantum yield, narrow half-peak width of a fluorescence emission peak, adjustable fluorescence emission spectrum, easy manufacture, and low costs. Therefore, at present, perovskite is widely applied to fields such as solar cells, light-emitting display, laser, and photoelectric detection.

In the related art, an application of perovskite is a manufacture of a light-emitting layer of a light-emitting diode.

SUMMARY

The present disclosure provides an array substrate, a method for manufacturing the same, a display panel, and a display apparatus.

According to an aspect, a method for manufacturing an array substrate is provided. The method includes:
  forming a patterned film layer on a side of a substrate, wherein the patterned film layer is provided with a plurality of grooves;
  forming a first precursor structure in the groove, wherein a material of the first precursor structure includes a first precursor; and
  disposing, in an environment of a gaseous second precursor, the substrate on which the first precursor structure is formed, such that the gaseous second precursor is reacted with the first precursor structure to form a perovskite crystal structure;
  wherein one of the first precursor and the second precursor includes a metal halide, and the other of the first precursor and the second precursor includes one of a formamidine halide, a methyl-amine halide, a cesium halide, and a hydrogen sulfide.

In some embodiments, forming the first precursor structure in the groove includes:
  coating a first precursor solution having a first concentration to the side of the substrate on which the patterned film layer is formed;
  acquiring a first precursor seed nucleus by precipitating a solute of the first precursor solution having the first concentration in the groove; and
  disposing, in a first precursor solution having a second concentration, the substrate on which the first precursor seed nucleus is formed, such that the first precursor seed nucleus grows up to form the first precursor structure;
  wherein the second concentration is greater than the first concentration.

In some embodiments, one of a target side of the substrate and the patterned film layer is hydrophilic, and the other of the target side of the substrate and the patterned film layer is hydrophobic, wherein the target side of the substrate is the side, on which the patterned film layer is formed, of the substrate; and
  the groove is communicated with the substrate, hydrophilicity or hydrophobicity of the first precursor solution is the same as hydrophilicity or hydrophobicity of the target side of the substrate and is opposite to hydrophilicity or hydrophobicity of the patterned film layer.

In some embodiments, precipitating the solute of the first precursor solution in the groove includes:
  disposing the substrate coated with the first precursor solution having the first concentration in an environment at a first temperature such that the solute is precipitated from the first precursor solution having the first concentration.

In some embodiments, disposing, in the first precursor solution having the second concentration, the substrate on which the first precursor seed nucleus is formed, such that the first precursor seed nucleus grows up to form the first precursor structure includes:
  disposing, in the first precursor solution having the second concentration, the substrate on which the first precursor seed nucleus is formed and keeping the first precursor solution having the second concentration at a second temperature such that the first precursor seed nucleus precipitated on the base grows up to form the first precursor structure.

In some embodiments, prior to disposing, in the first precursor solution having the second concentration, the substrate on which the first precursor seed nucleus is formed, the method further includes:
  adjusting a temperature of the substrate on which the first precursor seed nucleus is formed to a third temperature, wherein a temperature difference between the third temperature and the second temperature is less than a preset value.

In some embodiments, disposing, in the environment of the gaseous second precursor, the substrate on which the first precursor structure is formed, such that the gaseous second precursor is reacted with the first precursor structure to form the perovskite crystal structure includes:
  forming the gaseous second precursor by heating a solid second precursor; and
  injecting an inert gas and the gaseous second precursor to the target side of the substrate, such that the gaseous second precursor is reacted with the first precursor structure to form the perovskite crystal structure, wherein the target side of the substrate is the side of the substrate on which the patterned film layer is formed.

In some embodiments, injecting the inert gas and the gaseous second precursor to the target side of the substrate, such that the gaseous second precursor is reacted with the first precursor structure to form the perovskite crystal structure includes:
  disposing, in an environment at a fourth temperature, the substrate on which the first precursor structure is formed, and injecting the inert gas and the gaseous second precursor to the target side of the substrate such that the gaseous second precursor is reacted with the first precursor structure on the base to form the perovskite crystal structure.

In some embodiments, the fourth temperature ranges from 200° C. to 400° C.

In some embodiments, upon disposing, in the environment at the fourth temperature, the substrate on which the first precursor structure is formed, and injecting the inert gas and the gaseous second precursor to the target side of the substrate such that the gaseous second precursor is reacted with the first precursor structure on the substrate to form the perovskite crystal structure, the method further includes:

disposing, in an environment at a fifth temperature, the substrate on which the perovskite crystal structure is formed, for annealing for a specified time period.

In some embodiments, the fifth temperature ranges from 80° C. to 120° C.

In some embodiments, a chemical formula of the metal halide is MX, a chemical formula of the formamidine halide is $NH_3NHX$, and a chemical formula of the methyl-amine halide is $CH_3NH_2X_3$;

wherein M is one of lead, tin, antimony, bismuth, cesium, and silver, and X is one of chlorine, bromine, and iodine.

In some embodiments, forming the patterned film layer on the side of the substrate includes:

coating a polymer film layer to the side of the substrate;

acquiring a negative photoresist pattern by coating a negative photoresist to a side, distal from the base, of the polymer film layer distal from the substrate and patterning the negative photoresist; and etching the polymer film layer with the negative photoresist pattern as a mask, such that a plurality of grooves are formed in the polymer film layer and the patterned film layer is acquired.

In some embodiments, the plurality of grooves in the patterned film layer are arranged in an array.

According to another aspect, an array substrate is provided. The array substrate includes a substrate, a patterned film layer, and a perovskite crystal structure;

wherein the patterned film layer is disposed on a side of the substrate; the patterned film layer is provided with a plurality of grooves, and the perovskite crystal structure is disposed in the grooves.

In some embodiments, the grooves meet at least one of the following conditions:

the grooves are communicated with the substrate, one of a target side of the substrate and the patterned film layer is hydrophilic, and the other of the target side of the substrate and the patterned film layer is hydrophobic, wherein the target side of the substrate is the side, on which the patterned film layer is formed, of the substrate; and the plurality of grooves are arranged in an array.

In some embodiments, the perovskite crystal structure includes perovskite, and a chemical formula of perovskite is RMX;

wherein R is one of formamidine and methylamine, M is one of lead, antimony, tin, bismuth, cesium, and silver; and X is one of chlorine, bromine, and iodine.

In some embodiments, the substrate and the patterned film layer meet at least one of the following conditions:

the substrate is one of white glass, a silicon wafer, and a substrate coated with zinc oxide, and a material of the patterned film layer is polymethyl methacrylate, wherein a molecular weight of polymethyl methacrylate is not less than 100,000 and not greater than 500,000; and a side of the substrate is provided with a silane layer, and a material of the patterned film layer is one of polyethylene glycol, cellulose, polyacrylic acid, polyvinyl alcohol, and polyamide, wherein all molecular weights of polyethylene glycol, cellulose, polyacrylic acid, polyvinyl alcohol, and polyamide are not less than 100,000 and not greater than 500,000.

According to still another aspect, a display panel is provided. The display panel includes the array substrate as defined in another aspect.

According to still another aspect, a display apparatus is provided. The display apparatus includes a power supply assembly, and any array substrate according to another aspect or any display panel as defined in the still another aspect, wherein the power supply assembly is configured to supply power.

DETAILED DESCRIPTION

Figure 1:
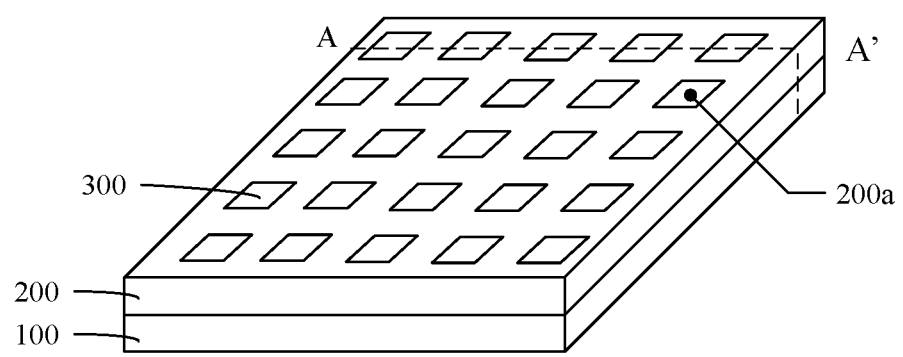
FIG. 1 is a schematic structural diagram of an array substrate according to an embodiment of the present disclosure.

The following describes the present disclosure in detail. Examples of embodiments of the present disclosure are illustrated in the accompanying drawings. Reference numerals which are the same or similar throughout the accompanying drawings represent the same or similar components or components with the same or similar functions. In addition, in the case that a detailed description of the known technology is unnecessary for the illustrated feature of the present disclosure, it is to be omitted. The embodiments described below with reference to the accompanying drawings are examples and used merely to interpret the present disclosure, rather than being construed as limitations to the present disclosure.

Those skilled in the art will appreciate that all terms (including technical and scientific terms) as used herein have the same meanings as commonly understood by those of ordinary skill in the art of the present disclosure, unless otherwise defined. It should be further understood that terms such as those defined in the general dictionary should be understood to have the meanings consistent with the meanings in the context of the prior art, and will not be interpreted in an idealized or overly formal meaning unless specifically defined as herein.

Those skilled in the art can appreciate that the singular forms "a", "an", "said", "the" and "this" may also encompass plural forms, unless otherwise stated. It should be further understood that the expression "include" in the description of the present disclosure means there is a feature, an integer, a step, an operation, an element and/or a component, but could not preclude existing or adding of one or more other features, integers, steps, operations, elements, components and/or groups thereof. The expression "and/or" as used herein includes all or any one of one or more of relevant listed items or all combinations thereof.

In the field of micro and nano manufacture, photoetching is usually applied to pattern an electronic material. However, a perovskite material is incompatible with the existing photoetching technology. This is mainly because the perovskite material is incompatible with various solvents. For example, the perovskite material is decomposed irreversibly when encountering water, alcohol, acetone, or the like. As a result, fluorescence of the perovskite material is severely quenched, which also means that it is impossible to use the existing photoetching technology to pattern the perovskite material.

In the related art, a micro-array structure (or patterning) is attempted to be formed by ink-jet printing of perovskite quantum dots. However, the following problems exist in ink-jet printing of perovskite quantum dots ink. In an aspect, a particle size of a perovskite quantum dot is large, causing a higher possibility of blocking a nozzle. In another aspect, stability of a perovskite quantum dot is very poor in different reagents and environments, causing higher difficulty in saving the perovskite quantum dot. In still another aspect, the boiling point, viscosity, and surface tension of a currently common quantum dot solvent (for example, octane or phenyl-cyclohexane) all need to meet certain conditions to meet a printing or film forming condition, and the difficulty in manufacturing perovskite quantum dot ink is higher. In addition, costs of an ink-jet printing device are higher.

A technology of patterning perovskite at the micro/nano scale is unavailable currently. Therefore, in the related art, in the case that perovskite is applied to manufacture a photoelectric device, a perovskite thin film is usually directly manufactured, but it is unable to acquire a perovskite micro-array structure.

FIG. 1 is a schematic structural diagram of an array substrate according to an embodiment of the present disclosure. As shown in FIG. 1, the array substrate includes a substrate 100, a patterned film layer 200, and a perovskite crystal structure 300.

Referring to FIG. 1, the patterned film layer 200 is disposed on a side of the substrate 100. The patterned film layer 200 is provided with a plurality of grooves 200a. The perovskite crystal structure 300 is disposed in the grooves 200a.

In some embodiments, still referring to FIG. 1, the plurality of grooves 200a in the patterned film layer 200 are arranged in an array.

In the array substrate according to the embodiment of the present disclosure, the perovskite crystal structure is formed in the grooves of the patterned film layer, such that the perovskite crystal structure in the plurality of grooves may form a perovskite micro-array structure. Because perovskite has an excellent fluorescence property, and the perovskite micro-array structure can better match the layout of the array substrate, performance of the array substrate can be better optimized.

Figure 2:
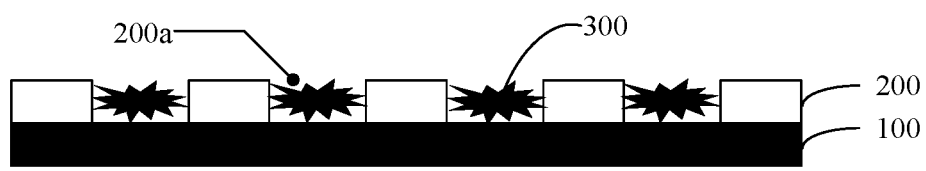
FIG. 2 is a schematic sectional view in an AA' direction of the array substrate shown in FIG. 1.

In some embodiments, the grooves 200a are communicated with the substrate 100. For example, FIG. 2 is a schematic sectional view in an AA' direction of the array substrate shown in FIG. 1. As shown in FIG. 2, the grooves 200a being communicated with the substrate 100 indicates that the grooves 200a penetrate the patterned film layer 200 in a direction perpendicular to a bearing surface of the substrate 100. One of a target side of the substrate 100 and the patterned film layer 200 is hydrophilic, and the other of the target side of the substrate 100 and the patterned film layer 200 has hydrophobicity. That is, the target side of the substrate 100 is hydrophilic, and the patterned film layer 200 has hydrophobicity; or the target side of the substrate 100 has hydrophobicity, and the patterned film layer 200 is hydrophilic. In the embodiment of the present disclosure, the target side of the substrate 100 is the side of the substrate 100, on which the patterned film layer 200 is formed.

A raw material for manufacturing the perovskite crystal structure includes a precursor solution. The precursor solution is described below in detail with reference to a method embodiment.

The target side of the substrate 100 has one of hydrophilicity and hydrophobicity. Specifically, the target side of the substrate 100 has a higher affinity to the precursor solution, such that adhesion of the precursor solution to a surface of the substrate 100 can be enhanced, which is beneficial for portions, exposed out of the grooves 200a, of the perovskite crystal structure 300 to grow and form on the substrate 100.

The patterned film layer 200 has the other of hydrophilicity and hydrophobicity. Specifically, the patterned film layer 200 has a lower affinity to the precursor solution, such that adhesion of the precursor solution to the patterned film layer 200 can be decreased, which facilitates boundary division of the manufactured perovskite crystal structure 300, thereby acquiring the perovskite micro-array structure.

Hydrophilicity indicates that a molecule having a polar group has a higher affinity to water and may attract a water molecule. A contact angle of water on a surface of a solid material composed of molecules having polar groups is 0° to 90°, that is, the surface of the solid material composed of molecules having polar groups is easy to be wetted by water.

Hydrophobicity indicates that a molecule tends to be non-polar, has a lower affinity to water, and may repel a water molecule. A contact angle of water on a surface of a solid material composed of molecules tending to be non-polar is 90° to 180°, that is, the surface of the solid material composed of molecules tending to be non-polar is hard to be wetted by water.

Optionally, the perovskite crystal structure 300 includes perovskite. A chemical formula of perovskite is RMX. R is one of formamidine and methylamine. M is one of lead, antimony, tin, bismuth, cesium, and silver. X is one of chlorine, bromine, and iodine.

Optionally, the perovskite crystal structure 300 includes a lead-containing perovskite quantum dot and/or a lead-free organic/inorganic lead halide perovskite quantum dot.

The lead-containing perovskite quantum dot is, for example, an organic/inorganic lead halide $MAPbX3$ quantum dot (MA=$CH_3NH_3$, and X=Cl, Br or I), wherein $CH_3NH_3PbI_3$ is red; $CH_3NH_3PbBr_3$ is green; and $CH_3NH_3PbCl_3$ is blue. The lead-free organic/inorganic lead halide perovskite quantum dot is, for example, a $CH_3NH_3SbX_3$ quantum dot, a $CH_3NH_3SnX_3$ quantum dot, and a $CH_3NH_3BiX_3$ (X=Cl, Br or I) quantum dot.

In an embodiment, the substrate 100 is one of white glass, a silicon wafer, and a substrate 100 coated with zinc oxide. Surfaces of these substrates 100 are rich in hydroxyl functional groups (—OH), may show hydrophilicity, and have higher affinities to hydrophilic liquid. The material of the patterned film layer 200 is polymethyl methacrylate. The molecular weight of polymethyl methacrylate is not less than 100,000 and not greater than 500,000. Functional groups of polymethyl methacrylate mainly include carbonyl groups (C=O) and ester groups (CH3OC=O), and may show hydrophobicity. Therefore, a hydrophilic precursor solution may be applied to manufacture the perovskite crystal structure, thereby decreasing adhesion of hydrophilic precursor solution to the patterned film layer 200 and enhancing adhesion of hydrophilic precursor solution to a surface of the substrate 100.

In another embodiment, the target side of the substrate 100 includes a silane layer, may show hydrophobicity, and has a higher affinity to hydrophobic liquid. The material of the patterned film layer 200 is one of polyethylene glycol, cellulose, polyacrylic acid, polyvinyl alcohol, and polyamide. All the molecular weights of polyethylene glycol, cellulose, polyacrylic acid, polyvinyl alcohol, and polyamide are not less than 100,000 and not greater than 500,000. The patterned film layer 200 can show hydrophilicity. Therefore, a hydrophobic precursor solution may be applied to manufacture the perovskite crystal structure, thereby decreasing adhesion of hydrophobic precursor solution to the patterned film layer 200 and enhancing adhesion of hydrophobic precursor solution to a surface of the substrate 100.

Because cellulose is insoluble in not only water but also a general organic solvent at ordinary temperatures, cellulose can be applied to manufacture the patterned film layer 200. Adhesion of the precursor solution to the patterned film layer 200 can be decreased no matter whether the precursor solution is hydrophilic or hydrophobic.

Optionally, the substrate 100 including the silane layer may be a hydrophobic silane reagent (for example, trimethyl chlorosilane, octadecyl chlorosilane, or hexamethyl disilazane). Surface modification is performed on a hydrophilic substrate (zinc oxide, white glass, a silicon wafer, or the like) by performing a gaseous silylanization method and an aqueous silylanization method, such that a surface of the substrate 100 is hydrophobized.

In summary, in the array substrate according to the embodiment of the present disclosure, the perovskite crystal structure is formed in the grooves of the patterned film layer, such that the perovskite crystal structure in the plurality of grooves may form a perovskite micro-array structure. Because perovskite has an excellent fluorescence property, and the perovskite micro-array structure can better match the layout of the array substrate, performance of the array substrate can be better optimized. In addition, hydrophilicity or hydrophobicity of the substrate is opposite to hydrophilicity or hydrophobicity of the patterned film layer manufactured on the substrate, and the precursor solution whose hydrophilicity or hydrophobicity is the same as hydrophilicity or hydrophobicity of the substrate and opposite to hydrophilicity or hydrophobicity of the patterned film layer is applied to manufacture the perovskite crystal structure, such that adhesion of the precursor solution to the patterned film layer can be decreased, and adhesion of the precursor solution to the surface of the substrate can be enhanced. This facilitates boundary division of the perovskite crystal structure 300, thereby better acquiring the perovskite micro-array structure.

Based on the same concept, an embodiment of the present disclosure further provides a display panel, including the array substrate according to the embodiment of present disclosure.

It should be noted that, the display panel includes the array substrate according to the above embodiment. The principle and the technical effect of the array substrate are described in the above embodiment and are not repeated in the present disclosure.

Optionally, the above array substrate may be applied to manufacture a liquid crystal display (LCD), a quantum dot display apparatus, a light-emitting device, a magnetic induction apparatus, a fluorescence induction apparatus, a photoelectric detector, or the like. An application scenario of the above array substrate is not limited in this embodiment of the present disclosure.

Based on the same concept, an embodiment of the present disclosure further provides a display apparatus. The display apparatus includes a power supply assembly, and the array substrate according to the above embodiment of the present disclosure or the display panel according to the above embodiment of the present disclosure. The power supply assembly is configured to supply power. The power supply assembly may be a power source.

It should be noted that, the display apparatus includes the array substrate or display panel according to the above embodiment. The principle and the technical effect of the array substrate or display panel are described in the above embodiment and are repeated in the present disclosure again.

Optionally, the display apparatus may be any product or component with a display function, such as electronic paper, a mobile phone, a tablet computer, a TV, a display, a notebook computer, a digital photo frame, or a navigator.

Figure 3:
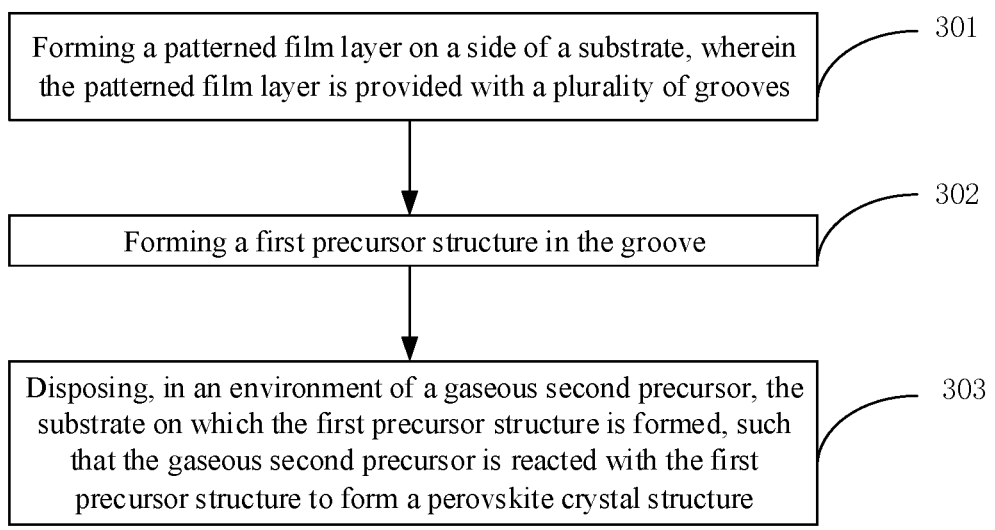
FIG. 3 is a schematic flowchart of a method for manufacturing an array substrate according to an embodiment of the present disclosure.

Based on the same concept, an embodiment of the present disclosure further provides a method for manufacturing an array substrate. FIG. 3 is a schematic flowchart of a method for manufacturing an array substrate according to an embodiment of the present disclosure. As shown in FIG. 3, the method includes the following steps 301 to 303.

In step 301, a patterned film layer is formed on a side of a substrate, wherein the patterned film layer is provided with a plurality of grooves.

In some embodiments, the plurality of grooves in the patterned film layer are arranged in an array.

In step 302, a first precursor structure is formed in the groove.

The material of the first precursor structure includes a first precursor.

In step 303, the substrate on which the first precursor structure is formed is disposed in an environment of a gaseous second precursor, such that the gaseous second precursor is reacted with the first precursor structure to form a perovskite crystal structure.

The first precursor includes a metal halide, and the second precursor includes one of a formamidine halide, a methyl-amine halide, a cesium halide, and a hydrogen sulfide. Alternatively, the first precursor includes one of the formamidine halide, the methyl-amine halide, and the cesium halide, and the second precursor includes the metal halide, that is, one of the first precursor and the second precursor includes the metal halide, and the other of the first precursor and the second precursor includes one of the formamidine halide, the methyl-amine halide, and the cesium halide.

In the embodiment of the present disclosure, first, the patterned film layer is formed on the side of the substrate. For example, the plurality of grooves that are in the patterned film layer and are arranged in an array may be formed by a patterning technology such as photoetching. Then, a solid perovskite precursor (namely, the first precursor) and another gaseous perovskite precursor (namely, the second precursor) are sequentially introduced into the groove to generate a perovskite crystal by in-situ gas-liquid reaction between the two precursors, thereby realizing orientated growth of a periodically arranged perovskite crystal structure in the groove. Therefore, patterned manufacture of perovskite at the micro/nano scale is realized. The first precursor structure is a crystal of the first precursor. A manufacture material of the perovskite crystal includes a metal halide, a formamidine halide, a methyl-amine halide, a cesium halide, a hydrogen sulfide, and/or the like, all of which are widely available, inexpensive and conductive to mass production.

In addition, the method may utilize an existing device such as a photoetching device and a chemical vapor deposition device, be compatible with an existing production line, and facilitate rapid introduction and mass production. Purchasing another expensive device (such as an ink-jet printer) is not required, such that investment costs can be reduced effectively.

The method may be applied to manufacture a perovskite nano-crystal micro-array for high-resolution photoelectric detection.

Optionally, the groove may penetrate the patterned film layer, that is, the groove is communicated with the substrate, and the substrate is exposed out of the bottom of the groove. Alternatively, the depth of the groove may be not greater than the thickness of the patterned film layer, that is, the groove is not communicated with the substrate, and the substrate is not exposed out of the bottom of the groove.

Figure 4:
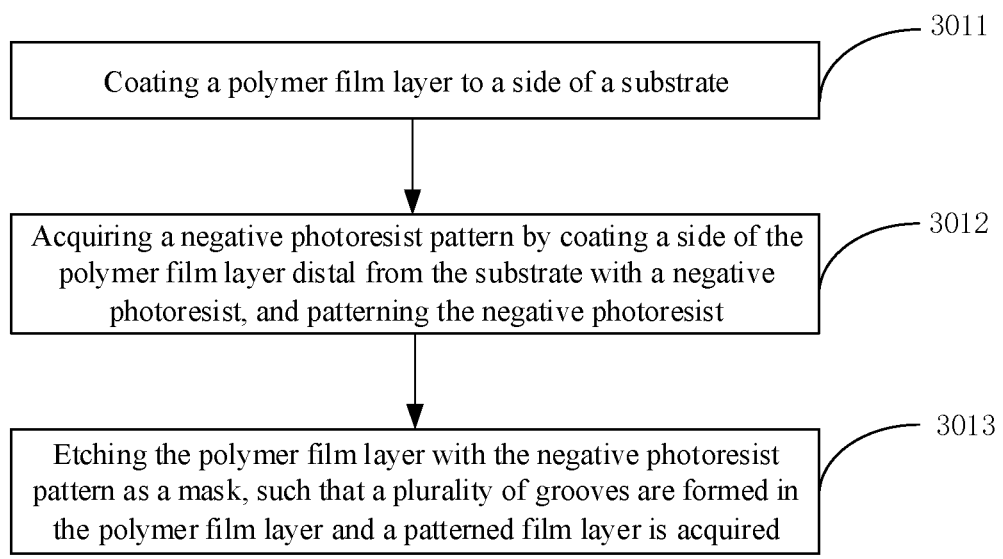
FIG. 4 is a schematic flowchart of forming a patterned film layer on a side of a substrate according to an embodiment of the present disclosure.

Optionally, FIG. 4 is a schematic flowchart of forming a patterned film layer on a side of a substrate (step 301) according to an embodiment of the present disclosure. As shown in FIG. 4, the process includes the following steps 3011 to 3013.

In step 3011, a side of a substrate is coated with a polymer film layer.

Figure 5:
FIG. 5 is a schematic structural diagram of coating a polymer film layer to a side of a substrate according to an embodiment of the present disclosure.

Optionally, the side of the substrate has one of hydrophilicity or hydrophobicity, and the polymer film layer has the other of hydrophilicity or hydrophobicity. For example, FIG. 5 is a schematic structural diagram of coating a polymer film layer to a side of a substrate according to an embodiment of the present disclosure. As shown in FIG. 5, an entire side of a substrate 100 is coated with a polymer film layer 200'.

The following embodiment of the present disclosure is described by an example of the first precursor including a metal halide and the second precursor including one of a formamidine halide, a methyl-amine halide, a cesium halide, and a hydrogen sulfide. Accordingly, the side of the substrate needs to show hydrophilicity, and the polymer film layer needs to show hydrophobicity.

The substrate may be white glass, a silicon wafer, or a substrate coated with zinc oxide. Surfaces of these substrates are rich in hydroxyl functional groups (—OH), and may show hydrophilicity. Polymethyl methacrylate whose molecular weight is not less than 100,000 and not greater than 500,000 may be selected as a manufacture material of the polymer film layer. Functional groups of polymethyl methacrylate mainly include carbonyl groups (C=O) and ester groups (CH3OC=O) and may show hydrophobicity.

In step 3011, a chloroform solution having polymethyl methacrylate may be prepared first. For example, 2 g of polymethyl methacrylate solid powder is dissolved in 98 ml of a chloroform solution, and ultrasonic treatment is performed for 0.5 to 1 hour until the polymethyl methacrylate solid powder is completely dissolved. The concentration of the polymethyl methacrylate solution may be selected from 2 to 15 mg/ml. Then, spin coating is performed on the side of the substrate by using 90 µl of the above prepared polymethyl methacrylate solution, to form a film. The revolving speed of the spin coating process may be selected from 1000 to 4000 revolutions per minute (rpm). The substrate is disposed on a heating stage at 50° C. to 120° C. for heating and film forming. The above step 3011 may be completed in an air environment.

Optionally, prior to coating the polymer film layer to the substrate, ultrasonic cleaning may be performed on the substrate. Specifically, the step is realized by the following fashion. In the case that the substrate is white glass, ultrasonic cleaning is performed by isopropanol. In the case that the substrate is a silicon wafer, ultrasonic cleaning is performed by water. In the case that the substrate is a substrate coated with zinc oxide, ultrasonic cleaning is performed by acetone.

In step 3012, a side of the polymer film layer distal from the substrate is coated with a negative photoresist, and the negative photoresist is patterned to acquire a negative photoresist pattern.

Figure 6:
FIG. 6 is a schematic structural diagram of coating a negative photoresist to a polymer film layer according to an embodiment of the present disclosure.

Optionally, 100 to 150 µl of the negative photoresist may be dropwise added to the side of the polymer film layer distal from the substrate, and then the revolving speed of the spin coater may be selected from 500 to 4000 rpm, to uniformly coat the polymer film layer with the negative photoresist. For example, FIG. 6 is a schematic structural diagram of coating a negative photoresist to a polymer film layer according to an embodiment of the present disclosure. As shown in FIG. 6, a side, distal from the substrate, of a polymer film layer 200' is coated with a negative photoresist 400.

In the above step 3012, patterning the negative photoresist may include photoresist exposure and photoresist development.

Figure 7:
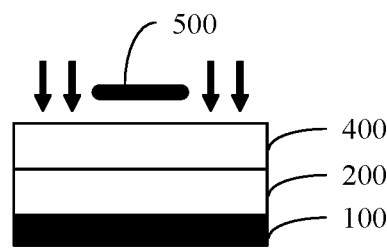
FIG. 7 is a schematic diagram of exposing a negative photoresist according to an embodiment of the present disclosure.
Figure 8:
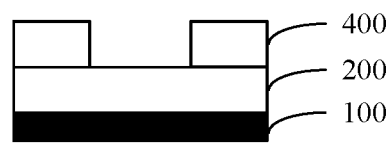
FIG. 8 is a schematic structural diagram of a developed negative photoresist according to an embodiment of the present disclosure.

Photoresist exposure includes aligning an exposure machine with the substrate 100 and exposing a specified pattern region of the negative photoresist 400 on the substrate 100 by a mask plate. The specified pattern region may be a target pixel region. For example, FIG. 7 is a schematic diagram of exposing a negative photoresist according to an embodiment of the present disclosure. As shown in FIG. 7, the negative photoresist 400 is exposed from a side of the negative photoresist 400 distal from the substrate 100 by a mask plate 500. Photoresist development includes soaking the exposed substrate 100 in a paraxylene solution for 30 to 180 seconds (s) to complete development, and finally taking out and drying the substrate 100. For example, FIG. 8 is a schematic structural diagram of a developed negative photoresist according to an embodiment of the present disclosure.

In response to being treated by the above steps, the negative photoresist 400 on the substrate 100 is completely patterned, such that a portion of a surface of the polymer film layer on the substrate 100 is still covered by the negative photoresist 400, but the other portions of the surface of the polymer film layer are not covered by the negative photoresist 400.

Patterning the polymer film layer 200' by the negative photoresist 400 has the following benefits. Compared with a positive photoresist, the negative photoresist 400 is widely available and inexpensive, thereby facilitating cost reduction and mass production. Compared with the positive photoresist that is applicable to acquiring an isolated hole and groove, the negative photoresist can better acquire a single-line pattern. Therefore, the negative photoresist 400 can better control the shape of the groove 200a (for example, a pixel region). For example, various rectangles (line shapes) pixel regions can be acquired, thereby realizing patterning growth of rectangles (or line shapes) at the micro/nano scale of various perovskite crystals (monocrystals or polycrystals) in the pixel regions.

It should be noted that, in the embodiment of the present disclosure, the polymer film layer may be patterned by a positive photoresist. The process and principle of patterning by the positive photoresist for can be referred to the process and the principle of patterning by the negative photoresist. Details are not repeated in the embodiment of the present disclosure.

In step 3013, the polymer film layer is etched with the negative photoresist pattern as a mask, such that a plurality of grooves are formed in the polymer film layer and a patterned film layer is acquired.

Figure 9:
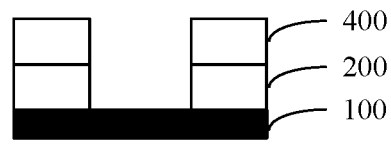
FIG. 9 is a schematic structural diagram of a dry etched polymer film layer according to an embodiment of the present disclosure.
Figure 10:
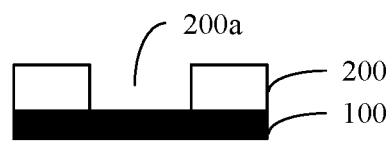
FIG. 10 is a schematic structural diagram of forming a patterned film layer on a substrate according to an embodiment of the present disclosure.

In the above step 3013, etching the polymer film layer may include dry etching and photoresist stripping. Dry etching includes bombarding the above substrate 100 by plasma (for example, oxygen or argon); and removing a portion that is of the polymer film layer on the substrate 100 and is not covered by the negative photoresist 400, such that the substrate 100 that is in a region not covered by the negative photoresist 400 is exposed again. For example, FIG. 9 is a schematic structural diagram of a dryly etched polymer film layer according to an embodiment of the present disclosure. Photoresist stripping includes soaking the above substrate 100 in acetone for 5 to 30 minutes (min); and stripping off the negative photoresist 400 remaining on the substrate 100 to acquire the patterned film layer 200 with the grooves 200a. For example, FIG. 10 is a schematic structural diagram of forming a patterned film layer on a substrate according to an embodiment of the present disclosure.

Patterning the polymer film layer is completed upon treatment in the above step, that is, micro-arrays arranged at intervals based on hydrophilicity/hydrophobicity are formed on the entire substrate 100. A region covered by the polymer film layer is hydrophobic, thereby having a lower affinity to the first precursor solution. This can decrease adhesion of the first precursor solution to the patterned film layer 200 and facilitate boundary definition of a manufactured perovskite crystal structure 300, thereby optimizing performance of the array substrate. A region not covered by the polymer film layer is hydrophilic, thereby having a higher affinity to the first precursor solution. This can enhance adhesion of the first precursor solution to a surface of the substrate 100, and is beneficial for portions, exposed out of the grooves 200a, of the perovskite crystal structure 300 to grow and form on the substrate 100.

Optionally, in the case that the first precursor includes one of a formamidine halide and a methyl-amine halide and the second precursor includes a metal halide, a corresponding first precursor solution may be prepared from the formamidine halide or the methyl-amine halide with an organic solvent such as chlorobenzene, paraxylene, or biphenyl. A side of the substrate needs to have hydrophobicity, the polymer film layer needs to have hydrophilicity (or hydrophobicity). In this case, the substrate 100 may selectively include a silane layer, and may have hydrophobicity, thereby having a higher affinity to a hydrophobic precursor solution. The polymer film layer may be selected one of polyethylene glycol, cellulose, polyacrylic acid, polyvinyl alcohol, and polyamide, and may have hydrophobicity, thereby decreasing adhesion of hydrophobic precursor solution to the patterned film layer 200. Because cellulose is insoluble in not only water but also a general organic solvent at ordinary temperatures, cellulose is applied to manufacture the patterned film layer 200. In this case, adhesion of the precursor solution can be decreased no matter whether the precursor solution is hydrophilic or hydrophobic.

Figure 11:
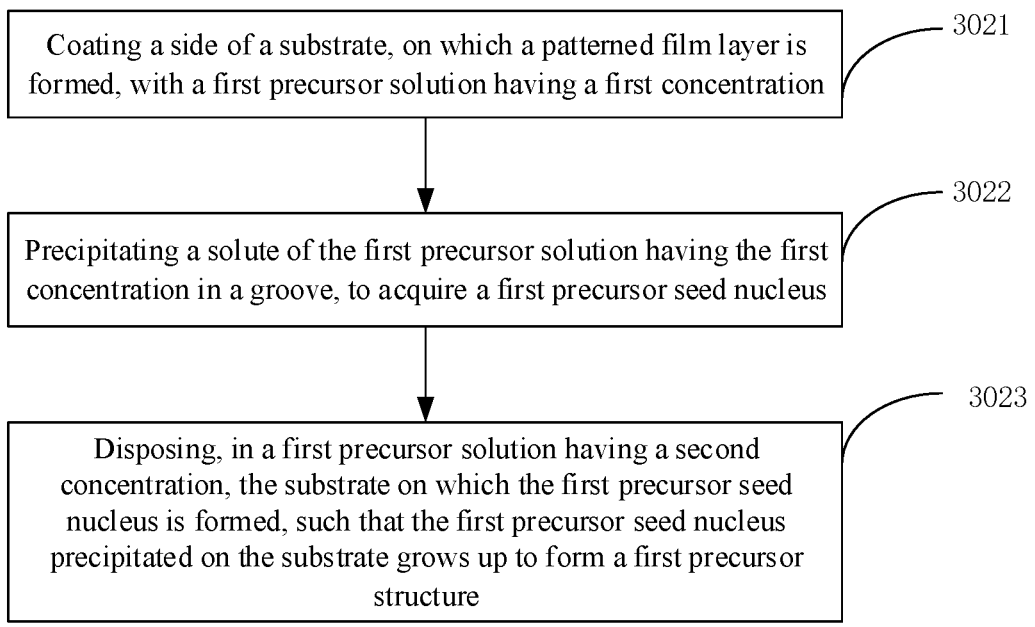
FIG. 11 is a schematic flowchart of forming a first precursor structure in a groove according to an embodiment of the present disclosure.

Optionally, FIG. 11 is a schematic flowchart of forming a first precursor structure in a groove (step 302) according to an embodiment of the present disclosure. As shown in FIG. 11, the process includes the following steps 3021 to 3023.

In step 3021, a side of a substrate on which a patterned film layer is formed is coated with a first precursor solution having a first concentration.

The step is described below by an example in which the first precursor is a metal halide $PbI_2$ (lead iodide).

The first precursor solution having the first concentration may be prepared by the following fashion: dissolving 0.1 g (gram) of $PbI_2$ in 100 g of deionized water to prepare a $2\times10^{-4}$ mol/L (moles per liter) $PbI_2$ dilute solution.

Figure 12:
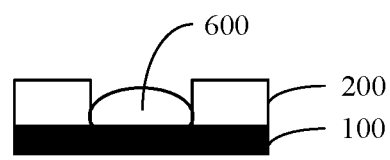
FIG. 12 is a schematic structural diagram of coating a substrate on which a patterned film layer is formed with a first precursor solution according to an embodiment of the present disclosure.

Specifically, an implementation process of the above step 3021 may include: dropwise adding 100 μL of a $PbI_2$ solution to the substrate 100 on which the patterned film layer 200 is formed; and then, selecting a value from 500 to 4000 rpm for the revolving speed of the spin coater. Owning to different wettabilities, the $PbI_2$ solution remains in an exposed region of the substrate 100 (for example, a target pixel region), but does not remain in other regions of the substrate 100. For example, FIG. 12 is a schematic structural diagram of coating a first precursor solution to a substrate on which a patterned film layer is formed according to an embodiment of the present disclosure. As shown in FIG. 12, a first precursor solution 600 remains in the exposed region (namely, the groove in the patterned film layer 200) of the substrate 100.

In step 3022, a solute of the first precursor solution having the first concentration in the groove is precipitated to acquire a first precursor seed nucleus.

Figure 13:
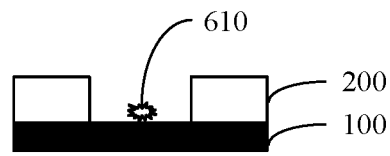
FIG. 13 is a schematic structural diagram of forming a first precursor seed nucleus on a substrate on which a patterned film layer is formed according to an embodiment of the present disclosure.

In the case that a solute of the $PbI_2$ solution in the groove is precipitated, a seed nucleus of $PbI_2$ salt is acquired in the groove. For example, FIG. 13 is a schematic structural diagram of forming a first precursor seed nucleus on a substrate on which a patterned film layer is formed according to an embodiment of the present disclosure. As shown in FIG. 13, a first precursor seed nucleus 610 is formed in the exposed region (namely, the groove in the patterned film layer 200) of the substrate 100.

Optionally, precipitating the solute of the first precursor solution 600 in the groove 200a includes: disposing the substrate 100 coated with the first precursor solution 600 of the first concentration in an environment at a first temperature until the solute (namely, the first precursor seed nucleus 610) is precipitated from the first precursor solution 600 of the first concentration.

In the embodiment of the present disclosure, precipitating indicates separating the solute from the solution. For example, the solute appears in a crystalline state. Methods for precipitating a crystal from a solution mainly include a solvent evaporation method and a hot saturated solution cooling method.

The solvent evaporation method is suitable for a solid solvent whose solubility is hard to be affected by a temperature change. The hot saturated solution cooling method is suitable for a solid solvent whose solubility is easy to be affected by a temperature change. Therefore, an appropriate method for precipitating the first precursor seed nucleus 610 may be selected based on the solubility of the first precursor. In the case that the first precursor solution is suitable for the solvent evaporation method, the first temperature may be set to a temperature higher than an environment temperature. In the case that the first precursor solution is suitable for the hot saturated solution cooling method, the first temperature may be set to a temperature lower than the environment temperature. It should be understood that in response to the solute being precipitated by the hot saturated solution cooling method, solvent removing, for example, dumping or blow-drying the solvent, is also required.

Specifically, the above substrate 100 coated with the $PbI_2$ solution is disposed on a heating stage at 80° C. to 150° C. for heating, that is, $PbI_2$ salt is precipitated by the solvent evaporation method, to acquire the seed nucleus of $PbI_2$ salt.

In step 3023, the substrate on which the first precursor seed nucleus is formed is disposed in a first precursor solution having a second concentration, such that the first precursor seed nucleus precipitated on the substrate grows up to form a first precursor structure.

Figure 14:
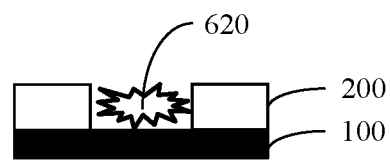
FIG. 14 is a schematic structural diagram of forming a first precursor structure on a substrate on which a patterned film layer is formed according to an embodiment of the present disclosure.

The second concentration is greater than the first concentration. The first precursor seed nucleus 610 may continue growing in an environment of the first precursor solution having the second concentration, to reach a required size and, the second concentration is greater than the first concentration of the first precursor solution, which may facilitate growth of the first precursor seed nucleus 610. For example, FIG. 14 is a schematic structural diagram of forming a first precursor structure on a substrate on which a patterned film layer is formed according to an embodiment of the present disclosure. As shown in FIG. 14, a first precursor structure 620 is formed in the exposed region (namely, the groove in the patterned film layer 200) of the substrate 100.

Specifically, the first precursor solution having the second concentration may be prepared in the following fashion: dissolving 2 g of $PbI_2$ in 100 g of deionized water to prepare a $4\times10^{-3}$ mol/L $PbI_2$ aqueous solution.

Optionally, an implementation of the above step 3023 includes disposing, in the first precursor solution having the second concentration, the substrate on which the first precursor seed nucleus is formed and keeping the first precursor solution having the second concentration at a second temperature until the first precursor structure is formed by a growth of the first precursor seed nucleus 610 precipitated on the substrate 100.

In the embodiment of the present disclosure, an appropriate second temperature may be selected based on the solubility of the first precursor, thereby increasing the speed at which the first precursor seed nucleus 610 continues growing in the environment of the first precursor solution having the second concentration.

In the case that the solubility of the first precursor is hard to be affected by a temperature change, the solvent evaporation method is applied to enable the first precursor seed nucleus 610 to continue growing, that is, the second temperature is set to a temperature higher than the environment temperature. In the case that the solubility of the first precursor is easy to be affected by a temperature change, the hot saturated solution cooling method is applied to enable the first precursor seed nucleus 610 to continue growing, that is, the second temperature is set to a temperature lower than the environment temperature. It should be understood that in response to the solute being precipitated by the hot saturated solution cooling method, solvent removing, for example, dumping or blow-drying the solvent, is also required.

Specifically, the above $4\times10^{-3}$ mol/L $PbI_2$ aqueous solution may be kept at 80° C. The substrate 100 on which the first precursor seed nucleus 610 is formed is soaked in the $PbI_2$ aqueous solution for 2 to 30 min, to enable $PbI_2$ in the groove in the patterned film layer grow up. In this way, orientated introducing of $PbI_2$ salt to a specified region is realized.

Optionally, a temperature of the substrate 100 on which the first precursor seed nucleus 610 is formed may also be adjusted to a third temperature prior to the substrate 100 on which the first precursor seed nucleus 610 is formed being disposed in the first precursor solution having the second concentration. The temperature difference between the third temperature and the second temperature is less than a preset value. For example, in the case that the solvent evaporation method is applied to enable the first precursor seed nucleus to continue growing to acquire the first precursor structure, the substrate 100 on which the first precursor seed nucleus 610 is formed may be disposed in the first precursor solution having the second concentration in response to being preheated to the third temperature.

In the embodiment of the present disclosure, the temperature of the substrate 100 on which the first precursor seed nucleus 610 is formed is adjusted to the third temperature, which is beneficial for decreasing the temperature difference between the substrate 100 and the first precursor solution having the second concentration, and enables the first precursor seed nucleus 610 on the substrate 100 to fast enter a growing state in the environment of the first precursor solution having the second concentration, thereby shortening growth time. It should be understood that the third temperature may be between the environment temperature and the second temperature or may be equal to the second temperature.

Specifically, the above substrate 100 may be first disposed on a heating stage at 80° C. for 1 to 2 min's preheating, and then disposed in a $4 \times 10^{-3}$ mol/L $PbI_2$ aqueous solution at 80° C.

Figure 15:
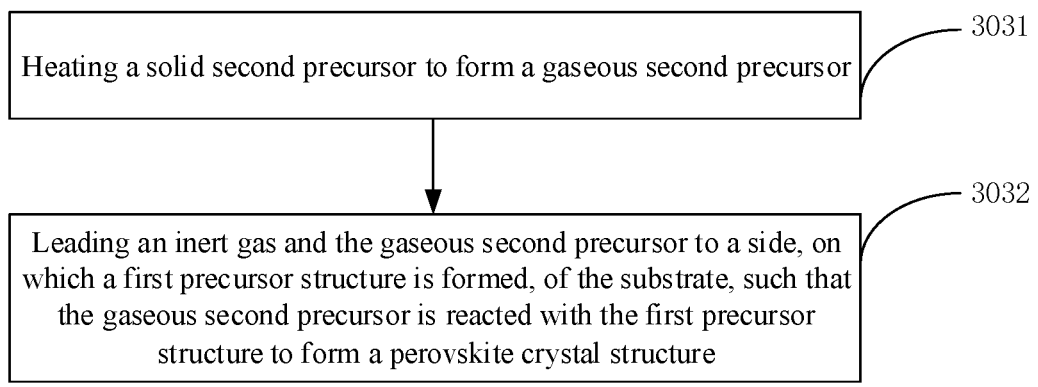
FIG. 15 is a schematic flowchart of forming a perovskite crystal structure by reaction between a second precursor and a first precursor according to an embodiment of the present disclosure.

Optionally, FIG. 15 is a schematic flowchart of forming a perovskite crystal structure by reaction between a second precursor and a first precursor (step 303) according to an embodiment of the present disclosure. As shown in FIG. 15, the process includes the following steps 3031 to 3032.

In step 3031, a solid second precursor is heated to form a gaseous second precursor.

The step is described below by an example in which the second precursor is methyl-amine halide ($CH_3NH_2I$, methyl-ammonium iodide). Specifically, in the above step 3031, $CH_3NH_2I$ powder may be heated to 200° C. to 400° C. for 30 to 60 min, so that solid $CH_3NH_2I$ powder is changed to gaseous steam.

In step 3032, an inert gas and the gaseous second precursor are led to a side, on which a first precursor structure is formed, of the substrate, such that the gaseous second precursor is reacted with the first precursor structure to form a perovskite crystal structure.

Figure 16:
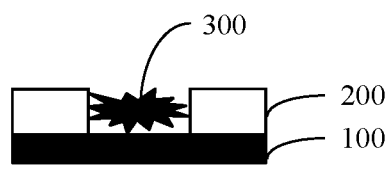
FIG. 16 is a schematic structural diagram of forming a perovskite crystal structure on a substrate on which a patterned film layer is formed according to an embodiment of the present disclosure.

For example, FIG. 16 is a schematic structural diagram of forming a perovskite crystal structure on a substrate on which a patterned film layer is formed according to an embodiment of the present disclosure. As shown in FIG. 16, a perovskite crystal structure 300 is formed in the exposed region (namely, the groove in the patterned film layer 200) of the substrate 100.

Specifically, in the above step 3032, the above $CH_3NH_2I$ steam is blown to the substrate 100 with $PbI_2$ salt micro-arrays by an inert gas such as high-purity nitrogen, such that gaseous $CH_3NH_2I$ sufficiently reacts with solid $PbI_2$ in the groove in the patterned film layer 200 to acquire a $CH_3NH_3PbI_3$ (methyl-ammonium lead iodide) crystal, namely, amine-intercalated metal halide—type perovskite. In this reaction process, $CH_3NH_3PbI_3$ first nucleates, then grows up, and finally forms the $CH_3NH_3PbI_3$ crystal.

Optionally, an implementation of the above step 3032 includes: disposing, in an environment at a fourth temperature, the substrate 100 on which the first precursor structure 620 is formed, and injecting the inert gas and the gaseous second precursor to the side, on which the first precursor structure 620 is formed, of the substrate 100 until the perovskite crystal structure is formed by the reaction between the gaseous second precursor and the first precursor structure 620 on the substrate 100.

Optionally, the fourth temperature ranges from 200° C. to 400° C.

Specifically, the $CH_3NH_2I$ powder may be disposed in a quartz boat, and the quartz boat may be disposed at a position of a heat source of a tube furnace fully filled with an inert gas such as high-purity nitrogen. The substrate 100 with the $PbI_2$ salt micro-arrays is disposed in a downstream direction of the inert gas. The distance between the substrate 100 and the $CH_3NH_2I$ quartz boat ranges from 10 to 20 cm. The tube furnace is heated to 200° C. to 400° C. for 30 to 60 min, such that gaseous $CH_3NH_2I$ sufficiently reacts with solid $PbI_2$ in the groove in the patterned film layer 200. Upon the reaction ends, the tube furnace gradually cools down to a room temperature.

Optionally, in response to and the perovskite crystal structure 300 being formed by the reaction between the gaseous second precursor and the first precursor structure 620 on the substrate 100, the substrate 100 on which the perovskite crystal structure 300 is formed may be further disposed in an environment at a fifth temperature, for annealing for a specified time period. Optionally, the fifth temperature ranges from 80° C. to 120° C.

In the embodiment of the present disclosure, the substrate 100 with the perovskite crystal structure 300 is disposed in the environment at the fifth temperature, and annealing is performed for a specified time period, such that the metallicity of the substrate 100 with the micro-array perovskite crystal structure 300 can be optimized.

Specifically, the above substrate 100 may be transferred into a glove box, the glove box may be disposed in a heating stage at 80° C. to 120° C., and annealing may be performed for 5 to 20 min.

In the above embodiments, the chemical formula of the metal halide is MX, the chemical formula of the formamidine halide is $NH_3NHX$, and the chemical formula of the methyl-amine halide is $CH_3NH_2X_3$. M is one of lead, antimony, tin, bismuth, cesium, and silver. X is one of chlorine, bromine, and iodine.

The embodiments of the present disclosure can achieve at least the following benefits.

1. The patterned film layer 200 is formed on a side of the substrate 100 by the patterning technology such as photoetching. The solid perovskite precursor (namely, the first precursor) and another gaseous perovskite precursor (namely, the second precursor) are sequentially introduced into the groove 200a to generate the perovskite crystal by in-situ gas-liquid reaction between the two precursors, thereby realizing orientated growth of a periodically arranged perovskite crystal structure 300 in the groove 200a. Therefore, patterned manufacture of perovskite at the micro/nano scale is realized.
2. The material of the perovskite crystal includes a metal halide, a formamidine halide, a methyl-amine halide, a cesium halide, a hydrogen sulfide, and the like, all of which are widely available, inexpensive, and conductive to mass production.
3. The method may utilize an existing device such as a photoetching device and a chemical vapor deposition device, be compatible with an existing production line, and facilitate rapid introduction and mass production. Purchasing another expensive device is not required, such that investment costs can be reduced effectively.
4. Patterning by the negative photoresist 400 has the following benefits. Compared with a positive photoresist, the negative photoresist 400 is widely available and inexpensive, thereby facilitating cost reduction and mass production. Compared with the positive photoresist that is applicable to acquiring an isolated hole and groove, the negative photoresist can better acquire a single-line pattern. Therefore, the negative photoresist 400 can better control the shape of the groove 200a (for example, a pixel region). For example, various rectangles (line shapes) pixel regions can be acquired, thereby realizing patterning growth of rectangles (or line shapes) at the micro/nano scale of various perovskite crystals (monocrystals or polycrystals) in a pixel.
5. The side of the substrate 100 has one of hydrophilicity or hydrophobicity. Specifically, the size of the substrate 100 has a higher affinity to the first precursor solution, such that adhesion of the first precursor solution to the surface of the substrate 100 can be enhanced, which is beneficial for portions, exposed out of the grooves 200a, of the perovskite crystal structure 300 to grow and form on the substrate 100. The patterned film layer 200 has the other of hydrophilicity and hydrophobicity. Specifically, the polymer film layer 200 has a lower affinity to the first precursor solution, such that adhesion of the first precursor solution to the patterned film layer 200 can be decreased, which facilitates boundary definitization of the manufactured perovskite crystal structure 300, thereby optimizing performance of the array substrate.

6. An appropriate method for precipitating the first precursor seed nucleus 610 may be selected based on the solubility of the first precursor. In the case that the first precursor solution is suitable for the solvent evaporation method, the first temperature may be set to a temperature higher than an environment temperature. In the case that the first precursor solution is suitable for the hot saturated solution cooling method, the first temperature may be set to a temperature lower than the environment temperature.

7. An appropriate second temperature may be selected based on the solubility of the first precursor, thereby optimizing the speed at which the first precursor seed nucleus 610 continues growing in the environment of the first precursor solution having the second concentration. In the case that the solubility of the first precursor is hard to be affected by a temperature change, the solvent evaporation method is applied to enable the first precursor seed nucleus 610 to continue growing, that is, the second temperature is set to a temperature higher than the environment temperature. In the case that the solubility of the first precursor is easy to be affected by a temperature change, the hot saturated solution cooling method is applied to enable the first precursor seed nucleus 610 to continue growing, that is, the second temperature is set to a temperature lower than the environment temperature.

8. The temperature of the substrate 100 with the first precursor seed nucleus 610 is adjusted to the third temperature that differs from the temperature of the first precursor solution having the second concentration by a temperature difference less than the preset value, which is beneficial for decreasing the temperature difference between the substrate 100 and the first precursor solution having the second concentration, and enables the first precursor seed nucleus 610 on the substrate 100 to fast enter a growing state in the environment of the first precursor solution having the second concentration, thereby shortening growth time.

9. In the case that the inert gas and the gaseous second precursor are injected to the substrate 100 in an environment at the fourth temperature, such that the gaseous second precursor is reacted with the first precursor structure to form a perovskite crystal structure 300, the method further includes: disposing the substrate 100 in an environment at the fifth temperature for annealing for a specified time period, such that the metallicity of the substrate 100 with the micro-array perovskite crystal structure 300 can be optimized.

10. The array substrate has the perovskite micro-array structure and can utilize the excellent fluorescence property of perovskite, and the perovskite micro-array structure can better match the layout of the array substrate, such that performance of the array substrate can be better optimized.

It can be understood by those skilled in the art that steps, measures and solutions in various operations, methods and processes discussed in the present disclosure may be alternated, modified, combined or deleted. Further, other steps, measures and solutions, with the various operations, methods and processes discussed in the present disclosure, may also be alternated, modified, rearranged, split, combined or deleted. Further, steps, measures and solutions in the prior art, with the various operations, methods and processes discussed in the present disclosure, may also be alternated, modified, rearranged, split, combined or deleted.

In the description of the present disclosure, it should be understood that orientation or position relationships indicated by terms such as "central", "upper", "lower", "front", "rear", "left", "right", "vertical", "horizontal", "top", "bottom", "inside", or "outside" are orientation or position relationships based on the accompanying drawings and are to facilitate the description of the present disclosure and simplify the description only, rather than indicating or implying that the apparatus or element referred to must have a particular orientation or be constructed and operated in a particular orientation, and is not interpreted as limiting the present disclosure.

The terms "first" and "second" are only for the purpose of description and should not be construed as indicating or implying relative importance or implicitly indicating the number of technical features indicated. Thus, the features defined by the terms "first" and "second" may include one or more of the features either explicitly or implicitly. In the description of the present disclosure, unless otherwise specified, "a plurality of" refers to two or more in number.

In this specification, the specific feature, structure, material and characteristic described may be combined in an appropriate manner in any one or more embodiments or examples.

It should be understood that although the various steps in the flowchart of the drawings are sequentially displayed as indicated by the arrows, these steps are not necessarily performed in the order indicated by the arrows. Except as explicitly stated herein, these steps are not performed in a strict sequential limit and may be performed in other sequences. Moreover, at least some of the steps in the flowchart of the drawings may include a plurality of sub-steps or stages, which are not necessarily performed simultaneously, but may be executed at different time. The execution order thereof is also not necessarily performed sequentially but may be performed in turn or alternately with at least a portion of other steps or sub-steps or stages of other steps.

The above description is only some embodiments of the present disclosure, and it should be noted that those skilled in the art may also make several improvements and modifications without departing from the principle of the present disclosure, and these improvements and modifications shall be included into the protection scope of the present disclosure.

What is claimed is:

1. A method for manufacturing an array substrate, comprising:
    forming a patterned film layer on a side of a substrate, wherein the patterned film layer is provided with a plurality of grooves;
    forming a first precursor structure in the groove, wherein a material of the first precursor structure comprises a first precursor; and
    disposing, in an environment of a gaseous second precursor, the substrate on which the first precursor structure is formed, such that the gaseous second precursor is reacted with the first precursor structure to form a perovskite crystal structure;
    wherein one of the first precursor and the gaseous second precursor comprises a metal halide, and the other of the first precursor and the gaseous second precursor comprises one of a formamidine halide, a methyl-amine halide, a cesium halide, and a hydrogen sulfide, wherein forming the first precursor structure in the groove comprises:
coating a first precursor solution having a first concentration to the side of the substrate on which the patterned film layer is formed;
acquiring a first precursor seed nucleus by precipitating a solute of the first precursor solution having the first concentration in the groove; and
disposing, in a first precursor solution having a second concentration, the substrate on which the first precursor seed nucleus is formed, such that the first precursor seed nucleus grows up to form the first precursor structure;
wherein the second concentration is greater than the first concentration.

2. The method according to claim 1, wherein one of a target side of the substrate and the patterned film layer is hydrophilic, and the other of the target side of the substrate and the patterned film layer is hydrophobic, wherein the target side of the substrate is the side of the substrate on which the patterned film layer is formed; and
the groove is communicated with the substrate, hydrophilicity or hydrophobicity of the first precursor solution is the same as hydrophilicity or hydrophobicity of the target side of the substrate, and is opposite to hydrophilicity or hydrophobicity of the patterned film layer.

3. The method according to claim 1, wherein precipitating the solute of the first precursor solution in the groove comprises:
disposing the substrate coated with the first precursor solution having the first concentration in an environment at a first temperature such that the solute is precipitated from the first precursor solution having the first concentration.

4. The method according to claim 1, wherein disposing, in the first precursor solution having the second concentration, the substrate on which the first precursor seed nucleus is formed, such that the first precursor seed nucleus grows up to form the first precursor structure comprises:
disposing, in the first precursor solution having the second concentration, the substrate on which the first precursor seed nucleus is formed, and keeping the first precursor solution having the second concentration at a second temperature such that the first precursor seed nucleus precipitated on the substrate grows up to form the first precursor structure.

5. The method according to claim 4, wherein prior to disposing, in the first precursor solution having the second concentration, the substrate on which the first precursor seed nucleus is formed, the method further comprises:
adjusting a temperature of the substrate on which the first precursor seed nucleus is formed to a third temperature, wherein a temperature difference between the third temperature and the second temperature is less than a preset value.

6. The method according to claim 1, wherein disposing, in the environment of the gaseous second precursor, the substrate on which the first precursor structure is formed, such that the gaseous second precursor is reacted with the first precursor structure to form a perovskite crystal structure comprises:
forming the gaseous second precursor by heating a solid second precursor; and
injecting an inert gas and the gaseous second precursor to the target side of the substrate, such that the gaseous second precursor is reacted with the first precursor structure to form the perovskite crystal structure, wherein the target side of the substrate is the side of the substrate on which the patterned film layer is formed.

7. The method according to claim 6, wherein injecting the inert gas and the gaseous second precursor to the target side of the substrate, such that the gaseous second precursor is reacted with the first precursor structure to form the perovskite crystal structure comprises:
disposing, in an environment at a fourth temperature, the substrate on which the first precursor structure is formed, and injecting the inert gas and the gaseous second precursor to the target side of the substrate such that the gaseous second precursor is reacted with the first precursor structure on the substrate to form the perovskite crystal structure.

8. The method according to claim 7, wherein the fourth temperature ranges from 200° C. to 400° C.

9. The method according to claim 7, wherein upon disposing, in the environment at the fourth temperature, the substrate on which the first precursor structure is formed, and injecting the inert gas and the gaseous second precursor to the target side of the substrate such that the gaseous second precursor is reacted with the first precursor structure on the substrate to form the perovskite crystal structure, the method further comprises:
disposing, in an environment at a fifth temperature, the substrate on which the perovskite crystal structure is formed for annealing for a specified time period.

10. The method according to claim 9, wherein the fifth temperature ranges from 80° C. to 120° C.

11. The method according to claim 1, wherein a chemical formula of the metal halide is MX, a chemical formula of the formamidine halide is $NH_3NHX$, and a chemical formula of the methyl-amine halide is $CH_3NH_2X_3$;
wherein M is one of lead, tin, antimony, bismuth, cesium, and silver, and X is one of chlorine, bromine, and iodine.

12. The method according to claim 1, wherein forming the patterned film layer on the side of the substrate comprises:
coating a polymer film layer to the side of the substrate;
acquiring a negative photoresist pattern by coating a negative photoresist to a side, distal from the substrate, of the polymer film layer and patterning the negative photoresist; and
etching the polymer film layer with the negative photoresist pattern as a mask, such that a plurality of grooves are formed in the polymer film layer and the patterned film layer is acquired.

13. The method according to claim 1, wherein the plurality of grooves in the patterned film layer are arranged in an array.

* * * * *